(12) United States Patent
Trimberger

(10) Patent No.: US 6,903,571 B1
(45) Date of Patent: Jun. 7, 2005

(54) PROGRAMMABLE SYSTEMS AND DEVICES WITH MULTIPLEXER CIRCUITS PROVIDING ENHANCED CAPABILITIES FOR TRIPLE MODULAR REDUNDANCY

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 17 days.

(21) Appl. No.: 10/717,349

(22) Filed: Nov. 18, 2003

(51) Int. Cl.⁷ .......................................... H03K 19/173
(52) U.S. Cl. .............................. 326/38; 326/41; 326/9; 326/15; 327/408
(58) Field of Search .......................... 326/8–15, 113, 326/38–41; 327/408

(56) References Cited

U.S. PATENT DOCUMENTS

| | | | |
|---|---|---|---|
| 4,985,647 A | 1/1991 | Kawada | |
| 5,352,940 A | 10/1994 | Watson | |
| 5,646,558 A | 7/1997 | Janshidi | |
| 5,962,881 A | 10/1999 | Young | |
| 6,380,765 B1 | 4/2002 | Forbest et al. | |
| 6,617,912 B1 | 9/2003 | Bauer | |
| 6,703,858 B2 * | 3/2004 | Knowles | 326/9 |
| 6,720,793 B1 * | 4/2004 | Trimberger | 326/9 |

* cited by examiner

*Primary Examiner*—Vibol Tan
(74) *Attorney, Agent, or Firm*—Lois D. Cartier

(57) ABSTRACT

Programmable systems and devices that include programmable multiplexers designed to minimize the impact of single event upsets (SEUs) on triple modular redundancy (TMR) circuits. In a programmable routing multiplexer, each path through the multiplexer is controlled by a different configuration memory cell. A unidirectional buffer is included on each routing path through the multiplexer. Therefore, an SEU changing the state of any single memory cell does not short together any two input terminals of the multiplexer. Hence, when a TMR circuit is implemented using the multiplexer, an SEU affecting the multiplexer causes no more than one TMR module to become defective. The other two TMR modules together provide the correct output signal, outvoting the defective module, and the circuit continues to operate correctly.

32 Claims, 4 Drawing Sheets

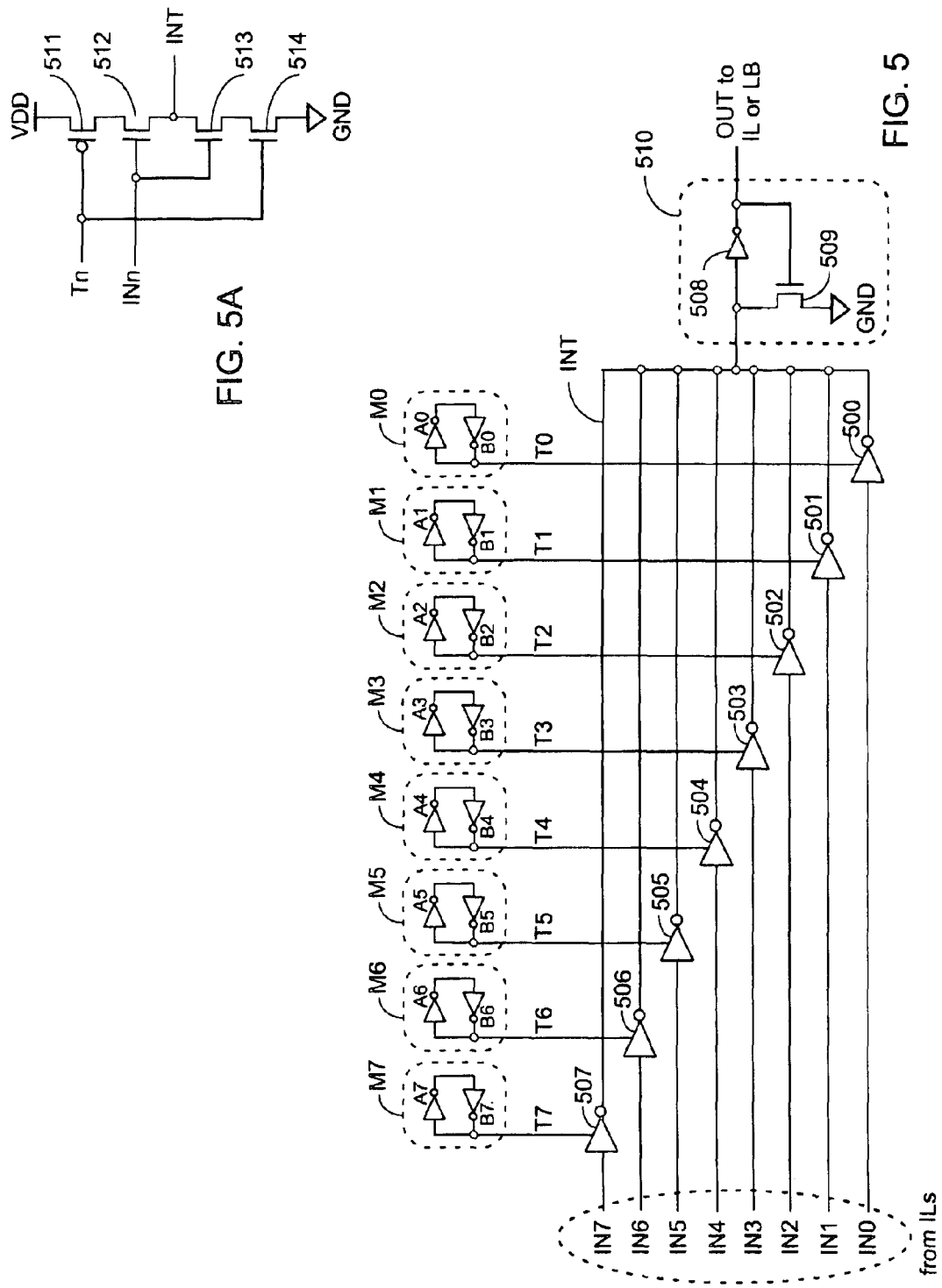

US 6,903,571 B1

PROGRAMMABLE SYSTEMS AND DEVICES WITH MULTIPLEXER CIRCUITS PROVIDING ENHANCED CAPABILITIES FOR TRIPLE MODULAR REDUNDANCY

FIELD OF THE INVENTION

The invention relates to triple modular redundancy (TMR) circuits implemented in programmable systems and devices. More particularly, the invention relates to programmable systems and devices that include programmable multiplexers designed to provide higher reliability for TMR circuits implemented therein.

BACKGROUND OF THE INVENTION

Programmable logic devices (PLDs) are a well-known type of integrated circuit that can be programmed to perform specified logic functions. FIG. 1 is a simplified illustration of one type of PLD, the Field Programmable Gate Array (FPGA). An FPGA typically includes an array of configurable logic blocks (LBs 101a–101i) and programmable input/output blocks (I/Os 102a–102d). Some FPGAs also include additional logic blocks with special purposes (not shown), e.g., DLLS, RAM, and so forth. The LBs and I/O blocks are interconnected by a programmable interconnection array that includes a large number of interconnect lines 103 interconnected by programmable interconnect points (PIPs 104, shown as small circles in FIG. 1). A PIP can be, for example, a pass gate. When the pass gate is turned on, the two nodes on either side of the pass gate are electrically connected. When the pass gate is turned off, the two nodes are isolated from each other. Thus, by controlling the values on the gate terminals of the pass gates, circuit connections can easily be made and altered.

PIPs are often coupled into groups (e.g., group 105) that implement programmable routing multiplexer circuits. A programmable routing multiplexer circuit (a "routing multiplexer") selects one of several interconnect lines (ILs) to provide a signal to a destination interconnect line or logic block.

The interconnection array and logic blocks are typically programmed by loading a stream of configuration data into internal configuration memory cells that define how the interconnection array and logic blocks are configured. In Field Programmable Gate Arrays (FPGAs), for example, each configuration memory cell is implemented as a static memory cell. The values stored in these static memory cells are used, for example, to control the gate terminals of pass gates between pairs of interconnect lines. The configuration data can be read from memory (e.g., from an external PROM) or written into the FPGA by an external device. The collective states of the individual memory cells then determine the function of the FPGA.

When subjected to unusual conditions such as cosmic rays or bombardment by neutrons or alpha particles, a static memory cell can change state. For example, a stored high value can be inadvertently changed to a low value, and vice versa. Sometimes these "single event upsets" (SEUs) have no effect on the functionality of the chip, for example, when the static memory cell controls a pass gate between two unused interconnect lines. At other times, an SEU can change the functionality of a configured PLD such that the circuit no longer functions properly.

FIG. 2 shows an exemplary programmable routing multiplexer circuit in a PLD. This type of circuit is commonly included in FPGA interconnect structures, for example. The number of input signals varies and is often greater than eight, but eight input signals are shown in the exemplary circuits herein, for clarity. The circuit selects one of several different input signals and passes the selected signal to an output node. As will be explained, an SEU affecting one of the configuration memory cells in the circuit can short together two of the multiplexer input terminals.

The circuit of FIG. 2 includes eight input terminals IN0–IN7 and eight pass gates 200–207 that selectively pass one of signals IN0–IN7, respectively, to an internal node INT. (In the present specification, the same reference characters are used to refer to terminals, signal lines, and their corresponding signals.) The signal on internal node INT is buffered by buffer BUF to provide output signal OUT. Buffer BUF, for example, can include two inverters 211, 212 coupled in series, and a pull-up (e.g., a P-channel transistor 113 to power high VDD) on internal node INT and driven by the node between the two inverters. However, buffer BUF can be implemented in many different ways.

Each pass gate 200–207 has a gate terminal driven by a memory cell M0–M7, respectively. Each memory cell Mn can include two cross-coupled inverters An and Bn, for example. However, memory cells M0–M7 can also be implemented in many different ways. For example, configuration memory cells in FPGAs typically include configuration logic for loading the configuration data. The details of memory cells M0–M7 are well known in the relevant arts and are omitted in the figures herein, for clarity.

The multiplexer circuit of FIG. 2 operates as shown in Table 1. At most, one of memory cells M0–M7 can be configured with a high value at any given time. Other configurations are not supported by the circuit. As shown in Table 1, the one memory cell with a high value selects the associated input signal IN0–IN7 to be passed to internal node INT, and hence to output node OUT. If none of memory cells M0–M7 is configured with a high value, output signal OUT is held at its initial high value by pull-up 213.

TABLE 1

| M7 | M6 | M5 | M4 | M3 | M2 | M1 | M0 | OUT |
| --- | --- | --- | --- | --- | --- | --- | --- | --- |
| 0 | 0 | 0 | 0 | 0 | 0 | 0 | 0 | High |
| 0 | 0 | 0 | 0 | 0 | 0 | 0 | 1 | IN0 |
| 0 | 0 | 0 | 0 | 0 | 0 | 1 | 0 | IN1 |
| 0 | 0 | 0 | 0 | 0 | 1 | 0 | 0 | IN2 |
| 0 | 0 | 0 | 0 | 1 | 0 | 0 | 0 | IN3 |
| 0 | 0 | 0 | 1 | 0 | 0 | 0 | 0 | IN4 |
| 0 | 0 | 1 | 0 | 0 | 0 | 0 | 0 | IN5 |
| 0 | 1 | 0 | 0 | 0 | 0 | 0 | 0 | IN6 |
| 1 | 0 | 0 | 0 | 0 | 0 | 0 | 0 | IN7 |

In the multiplexer circuit of FIG. 2, the upset of any single memory cell (i.e., any SEU affecting any of memory cells M0–M7) causes a failure in the circuit. For example, assume that memory cell M0 stores a high value, while memory cells M1–M7 store low values. Pass gate 200 is enabled, and the selected input signal is IN0. Pass gates 201–207 are disabled. If the value in memory cell M0 is upset (i.e., changes to a low value), the path from input terminal IN0 to output terminal OUT is broken, and output signal OUT is no longer actively driven by node IN0. If the value in-memory cell M4 is upset (i.e., changes to a high value), pass gate 204 is enabled and there is a "short" (an inadvertent coupling) between input terminals IN0 and IN4. Similarly, if the value in memory cell M5 is upset, pass gate 205 is enabled and there is a short between nodes IN0 and IN5, and so forth. Thus, an SEU affecting one of the configuration memory cells in the circuit of FIG. 2 can short together two of the multiplexer input terminals.

Further, as operating voltages diminish, static memory cells become more susceptible to changes in state caused by SEUs. To reduce manufacturing costs, PLD manufacturers are aggressively reducing device sizes in their. PLDs. These smaller devices often operate at lower voltages. Therefore, all else being equal, there is a tendency towards greater SEU susceptibility in PLDs.

Circuits and methods have been developed to avoid the problems associated with SEUs. One well-known strategy for avoiding such problems is illustrated in FIG. 3. The illustrated circuit is called a triple modular redundancy (TMR) circuit. In essence, the required logic is implemented three times (i.e., in three modules), and the results generated by the three modules are compared. Any two module output signals that are the same are considered to be correct, and if the third module provides a different result the "dissenting vote" is thrown out.

The TMR circuit of FIG. 3 includes modules M1–M3, representing three implementations of the same logical function. Each module has a respective output signal 01–03 that drives voting circuit VC. Voting circuit VC implements the function (01 AND 02) OR (02 AND 03) OR (01 AND 03) and provides the result as the output signal of the circuit.

Clearly, this approach overcomes any SEU that affects the functionality of only one of the three modules M1–M3. The module affected by the event produces an incorrect result, which is overridden in the voting circuit by the other two modules. However, while the circuit of FIG. 3 works well for errors that occur within one of modules M1–M3, it does not work when two of the three modules are in error, causing two of the three inputs to the voting circuit to be incorrect. Such a situation can occur, for example, when an SEU causes a short between two input terminals of a routing multiplexer, and the two input terminals are coupled to nodes in two different modules.

Circuits implemented in a PLD are not necessarily implemented in discrete regions of the device. The best implementation of the circuit of FIG. 3 in terms of performance or minimizing resource usage might be to physically intermix the logic for the three modules M1–M3. In that case, internal nodes in two different modules can easily be separated by only a single disabled PIP in one routing multiplexer.

Similarly, SEUs can cause inadvertent connections between a node in one of the modules M1–M3 and a node in the voting circuit VC, or between two different nodes in voting circuit VC, or between nodes in two different voting circuits.

Therefore, it is desirable to facilitate the use of TMR in programmable systems and devices by providing programmable routing multiplexer circuits in which the input terminals cannot be shorted together by a single SEU.

SUMMARY OF THE INVENTION

The invention provides programmable systems and devices that include programmable multiplexers designed to minimize the impact of single event upsets (SEUs) on triple modular redundancy (TMR) circuits. In a programmable routing multiplexer, each path through the multiplexer is controlled by a different configuration memory cell. A unidirectional buffer is included on each routing path through the multiplexer. Therefore, an SEU changing the state of any single memory cell does not short together any two input terminals of the multiplexer. Hence, when a TMR circuit is implemented using the multiplexer, an SEU affecting the multiplexer causes no more than one TMR module to become defective. The other two TMR modules together provide the correct output signal, outvoting the defective module, and the circuit continues to operate correctly.

According to one aspect of the invention, a programmable logic device (PLD) that facilitates the use of TMR includes a plurality of programmable logic blocks, a plurality of interconnect lines, and a plurality of programmable routing multiplexer circuits programmably interconnecting the interconnect lines with each other and with the programmable logic blocks. Each programmable routing multiplexer circuit includes a plurality of multiplexer input terminals, a multiplexer output terminal, a plurality of configuration memory cells, and a plurality of unidirectional logic circuits. Each unidirectional logic circuit has an input terminal coupled to an associated multiplexer input terminal, an output terminal coupled to the multiplexer output terminal, and a control terminal coupled to an output terminal of an associated configuration memory cell. In some embodiments, each programmable routing multiplexer circuit also includes an output buffer coupled between the output terminals of the unidirectional logic circuits and the multiplexer output terminal.

In some embodiments, the unidirectional logic circuit includes a unidirectional buffer and a pass gate coupled in series, with a gate terminal of the pass gate being coupled to the output terminal of the associated configuration memory cell. In some embodiments, the unidirectional logic circuit is a tristate buffer having an input terminal coupled to an associated multiplexer input terminal, an output terminal coupled to the multiplexer output terminal, and an enable terminal coupled to the output terminal of the associated configuration memory cell.

In some embodiments, the PLD is programmed to implement a TMR circuit. A first programmable logic block is programmed to implement at least a portion of a first TMR module, and a second programmable logic block is programmed to implement at least a portion of a second TMR module. One of the programmable routing multiplexer circuits has a first multiplexer input terminal coupled to an output terminal of the first programmable logic block and a second multiplexer input terminal coupled to an output terminal of the second programmable logic block.

According to another aspect of the invention, a system is controlled by memory cells susceptible to SEUS. The system includes a plurality of logic circuits, a plurality of interconnect lines, and plurality of programmable routing multiplexer circuits programmably interconnecting the interconnect lines with each other and with the logic circuits. Each of the programmable routing multiplexer circuits includes a plurality of multiplexer input terminals, a multiplexer output terminal, a plurality of memory cells susceptible to SEUs, and plurality of unidirectional logic circuits. Each unidirectional logic circuit has an input terminal coupled to an associated multiplexer input terminal, an output terminal coupled to the multiplexer output terminal, and a control terminal coupled to an output terminal of an associated memory cell.

BRIEF DESCRIPTION OF THE DRAWINGS

The present invention is illustrated by way of example, and not by way of limitation, in the following figures.

FIG. 5 illustrates a programmable routing multiplexer circuit implemented according to another embodiment of the invention.

FIG. 5A illustrates an exemplary implementation of the tristate buffers included in FIG. 5.

DETAILED DESCRIPTION OF THE DRAWINGS

The present invention is believed to be applicable to a variety of programmable systems and devices. The present invention has been found to be particularly applicable and beneficial for programmable logic devices (PLDs) such as field programmable gate arrays (FPGAs). While the present invention is not so limited, an appreciation of the present invention is presented by way of specific examples, in this instance with FPGAs designed to provide higher reliability for triple modular redundancy (TMR) circuits implemented therein.

Figure 4:
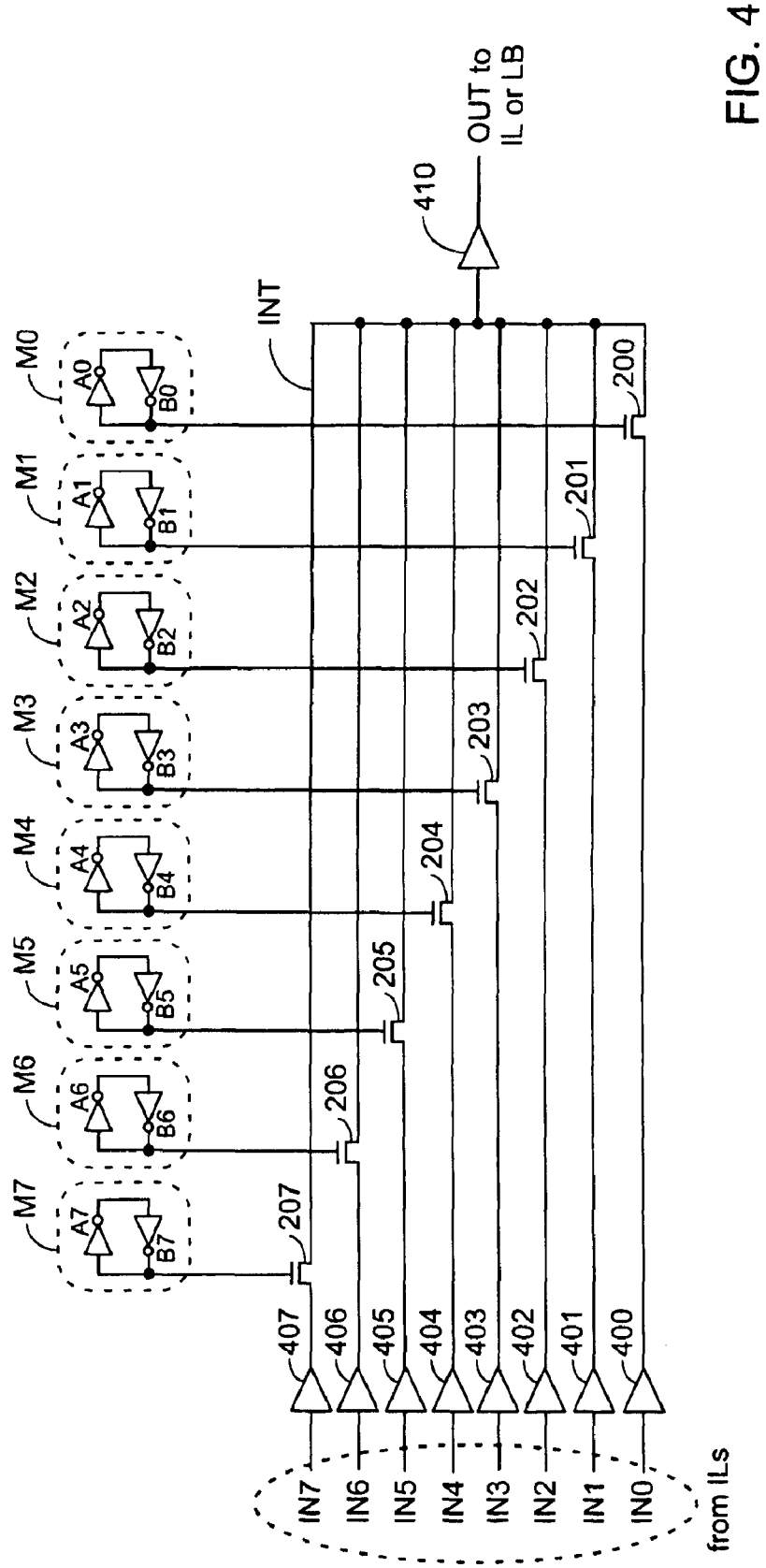
FIG. 4 illustrates a programmable routing multiplexer circuit implemented according to one embodiment of the invention.

The invention provides a multiplexer circuit that isolates the input terminals of the multiplexer circuit from each other even in the event of an SEU, by including a unidirectional logic circuit on each path through the multiplexer circuit. FIGS. 4 and 5 illustrate two exemplary implementations.

FIG. 4 shows a multiplexer circuit in a programmable logic device. The circuit of FIG. 4 includes eight input terminals IN0–IN7, eight unidirectional buffers 400–407, eight pass gates 200–207, eight configuration memory cells M0–M7, and an output buffer 410.

Each input terminal IN0–IN7 provides an input signal from a PLD interconnect line to an associated unidirectional buffer 400–407, respectively, and hence to an associated pass gate 200–207, respectively. Pass gates 200–207 selectively pass one of signals IN0–IN7, respectively, to an internal node INT. The signal on internal node INT is buffered by output buffer 410 to provide an output signal OUT to a PLD interconnect line or logic block. Output buffer 410, for example, can be implemented in a similar fashion to buffer BUF from FIG. 2. However, buffer 410 can be implemented in many different ways. For example, buffer 410 can be inverting or non-inverting.

Figure 1:
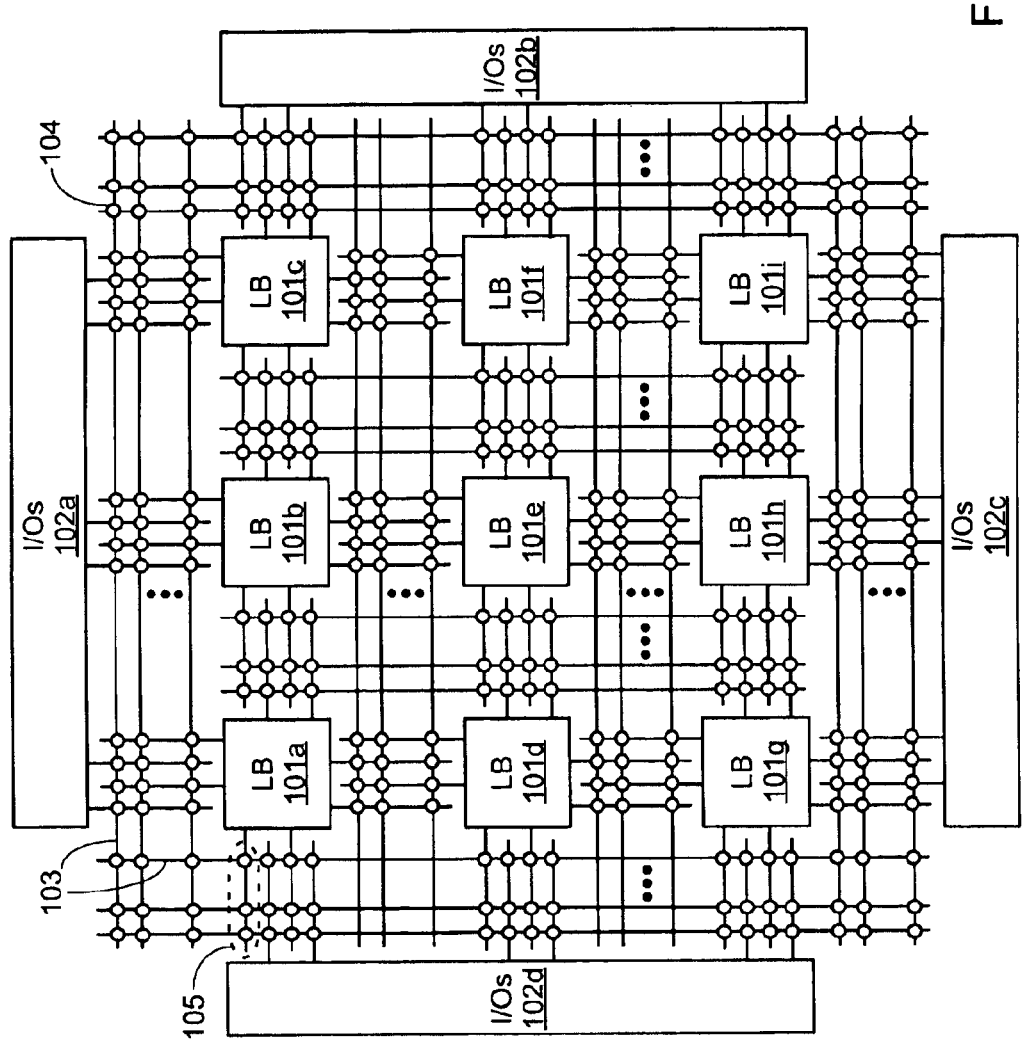
FIG. 1 illustrates an exemplary field programmable gate array (FPGA).
Figure 2:
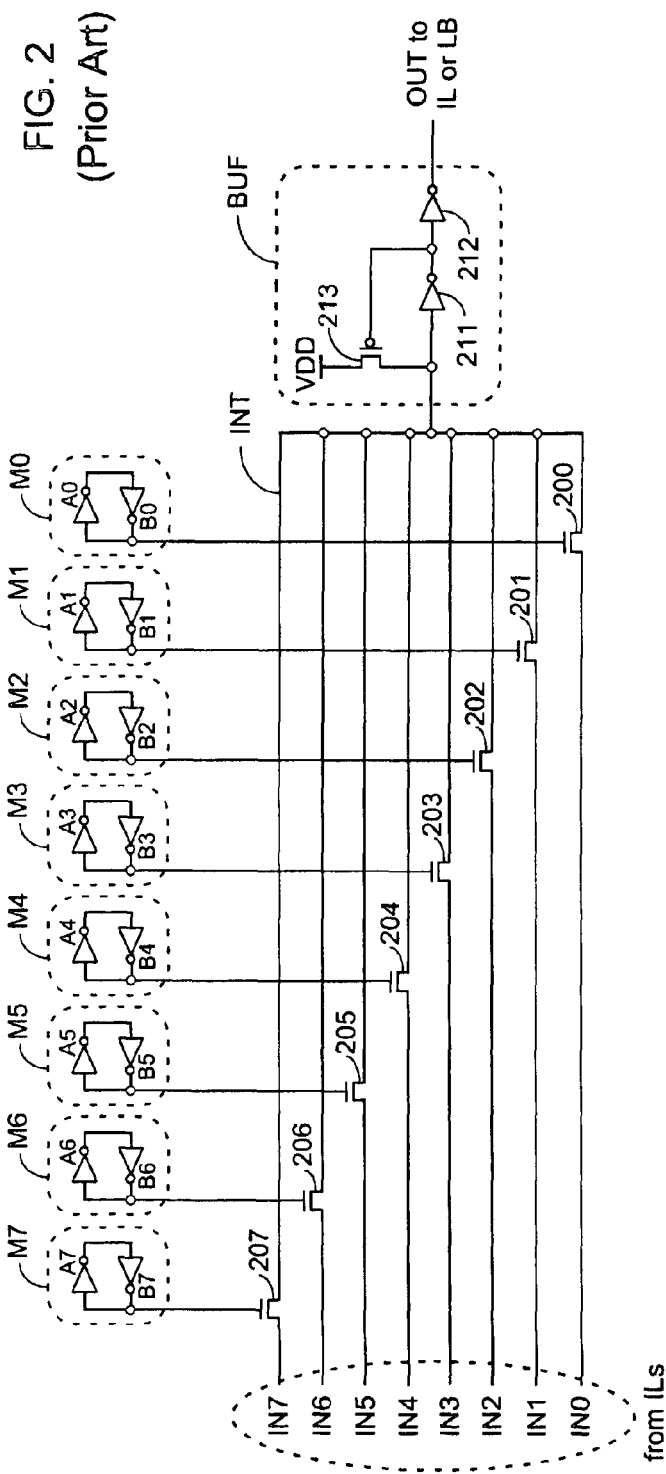
FIG. 2 illustrates a typical programmable routing multiplexer circuit as implemented in the FPGA of FIG. 1.
Figure 3:
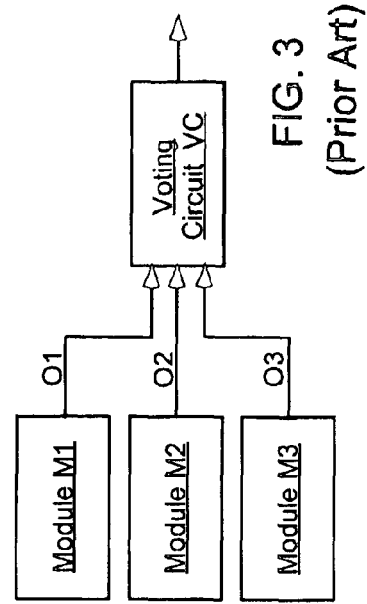
FIG. 3 is a block diagram of a well-known triple modular redundancy (TMR) circuit.

Pass gates 200–207 each have a gate terminal coupled to an associated memory cell M0–M7, respectively. The memory cells M0–M7 can be implemented, for example, as shown in FIG. 2. However, memory cells M0–M7 can be implemented in many different ways.

In some embodiments (i.e., where buffer 410 is implemented in the same fashion as buffer BUF of FIG. 2), the multiplexer circuit of FIG. 4 operates as shown in Table 1. However, in the circuit of FIG. 4, an SEU that affects any of the configuration memory cells M0–M7 cannot cause a short between any of the input terminals IN0–IN7.

When the multiplexer circuit of FIG. 4 is correctly configured, only one of memory cells M0–M7 stores a high value at any given time. For example, suppose memory cell M0 stores a high value and memory cells M1–M7 each store a low value. Pass gate 200 is on (enabled) and pass gates 201–207 are all off (disabled). Input signal IN0 is passed to internal node INT. If the value stored in memory cell M1 flips from low to high due to an SEU, both of input signals IN0 and IN1 are passed to internal node INT, probably resulting in an error at internal node INT and output terminal OUT. However, the voltage level on internal node INT is not passed back to either of input terminals IN0 and IN1, due to the presence of unidirectional buffers 400–401.

For example, suppose a TMR circuit is implemented in a PLD that includes the multiplexer circuit of FIG. 4. Output signal OUT can be included in a TMR module or in the voting circuit. If signal OUT is part of the voting module, an SEU affecting signal OUT will render the TMR circuit inoperable. However, if signal OUT is part of one of the TMR modules, an SEU affecting signal OUT affects only that module. Unlike the multiplexer circuit of FIG. 2, the SEU cannot cause errors in two different TMR modules. Thus, the voting circuit performs its function of disregarding the erroneous signal from the affected module, and the TMR circuit continues to function properly.

Note that in the example of FIG. 4, the unidirectional buffers 400–407 can be placed either before or after pass gates 200–207 on the signal paths through the multiplexer circuit.

FIG. 5 shows another implementation of the invention, in which the unidirectional logic circuits are implemented as tristate buffers. The circuit of FIG. 5 is similar to that of FIG. 4, except that the unidirectional buffers and pass gates are replaced by unidirectional tristate buffers. As in the circuit of FIG. 4, the input terminals cannot be shorted together by a single SEU. The circuit of FIG. 5 includes eight input terminals IN0–IN7, eight unidirectional tristate buffers 500–507, eight configuration memory cells M0–M7, and an output buffer 510.

Each input terminal IN0–IN7 provides an input signal from a PLD interconnect line to an associated unidirectional tristate buffer 500–507, respectively. Tristate buffers 500–507 selectively pass one of signals IN0–IN7, respectively, to an internal node INT. The signal on internal node INT is buffered by buffer 510 to provide an output signal OUT to a PLD interconnect line or logic block.

Output buffer 510, for example, can be implemented in a similar fashion to buffer BUF from FIG. 2. However, output buffer 510 can be implemented in many different ways. In the pictured embodiment, output buffer 510 includes an inverter 508 and a pull-down 509. Inverter 508 is driven by internal node INT and provides output signal OUT. Pull-down 509 is an N-channel transistor coupled between node INT and ground GND, and is gated by output signal OUT.

Tristate buffers 500–507 each have an enable terminal coupled to the output T0–T7, respectively, of a respective memory cell M0–M7. Memory cells M0–M7 can be implemented, for example, as shown in FIG. 2. However, memory cells M0–M7 can be implemented in many different ways.

Tristate buffers 500–507 can be implemented, for example, as shown in FIG. 5A. Coupled between power high VDD and ground GND, in order, are P-channel transistor 511, N-channel transistor 512, internal node INT, N-channel transistor 513, and N-channel transistor 514. Signal Tn (T0–T7) is coupled to the gates of transistors 511 and 514. Signal INn (IN0–IN7) is coupled to the gates of transistors 512 and 513. When signal Tn is high, transistors 512 and 513 are both on, and the buffer functions as an inverter. When signal Tn is low, transistors 512 and 513 are both off, and the path between input terminal INn and node INT is broken. Many alternative implementations of tristate buffers 500–507 will be clear to those of skill in the relevant arts.

Those having skill in the relevant arts of the invention will now perceive various modifications and additions that can be made as a result of the disclosure herein. For example, the above text describes the circuits of the invention in the context of field programmable gate arrays (FPGAs) controlled by configuration data stored in static memory cells. However, the circuits of the invention can also be implemented in other programmable systems and devices subject to the effects of single event upsets.

Further, pass gates, transistors, pull-ups, pull-downs, buffers, tristate buffers, unidirectional logic circuits, memory cells, and other components other than those described herein can be used to implement the circuits of the invention. Active-high signals can be replaced with active-low signals by making straightforward alterations to the circuitry, such as are well known in the art of circuit design. For example, tristate buffers with active-high enable terminals can be replaced by tristate buffers with active-low enable terminals. Pass gates can be implemented as CMOS pass gates including paired N- and P-channel transistors enabled by a single memory cell, and so forth.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A programmable logic device (PLD) that facilitates the use of triple modular redundancy (TMR), the PLD comprising:
   a plurality of programmable logic blocks;
   a plurality of interconnect lines; and
   a plurality of programmable routing multiplexer circuits programmably interconnecting the interconnect lines with each other and with the programmable logic blocks,
   wherein each programmable routing multiplexer circuit comprises:
      a plurality of multiplexer input terminals;
      a multiplexer output terminal;
      a plurality of configuration memory cells; and
      a plurality of unidirectional logic circuits, each unidirectional logic circuit having an input terminal coupled to an associated multiplexer input terminal, an output terminal coupled to the multiplexer output terminal, and a control terminal coupled to an output terminal of an associated configuration memory cell.

2. The PLD of claim 1, wherein:
   a first programmable logic block is programmed to implement at least a portion of a first TMR module;
   a second programmable logic block is programmed to implement at least a portion of a second TMR module; and
   one of the programmable routing multiplexer circuits has a first multiplexer input terminal coupled to an output terminal of the first programmable logic block and a second multiplexer input terminal coupled to an output terminal of the second programmable logic block.

3. The PLD of claim 1, wherein each unidirectional logic circuit comprises a unidirectional buffer and a pass gate coupled in series between the associated multiplexer input terminal and the multiplexer output terminal, the pass gate having a gate terminal coupled to the output terminal of the associated configuration memory cell.

4. The PLD of claim 3, wherein the pass gates comprise N-channel transistors.

5. The PLD of claim 3, wherein the unidirectional buffer is a non-inverting buffer.

6. The PLD of claim 1, wherein each unidirectional logic circuit comprises a tristate buffer having an input terminal coupled to an associated multiplexer input terminal, an output terminal coupled to the multiplexer output terminal, and an enable terminal coupled to the output terminal of the associated configuration memory cell.

7. The PLD of claim 6, wherein the tristate buffer is an inverting buffer, and each of the programmable routing multiplexer circuits further comprises an inverting output buffer having an input terminal coupled to the multiplexer output terminal.

8. The PLD of claim 1, wherein each of the programmable routing multiplexer circuits further comprises an output buffer having an input terminal coupled to the multiplexer output terminal.

9. The PLD of claim 1, wherein the PLD is a field programmable gate array (FPGA).

10. The PLD of claim 1, wherein each programmable routing multiplexer circuit comprises eight multiplexer input terminals, eight configuration memory cells, and eight unidirectional logic circuits.

11. The PLD of claim 1, wherein each programmable routing multiplexer circuit further comprises an output buffer coupled between the output terminals of the unidirectional logic circuits and the multiplexer output terminal.

12. A system controlled by memory cells susceptible to single event upsets (SEUs), the system comprising:
   a plurality of logic circuits;
   a plurality of interconnect lines; and
   a plurality of programmable routing multiplexer circuits programmably interconnecting the interconnect lines with each other and with the logic circuits,
   wherein each of the programmable routing multiplexer circuits comprises:
      a plurality of multiplexer input terminals;
      a multiplexer output terminal;
      a plurality of memory cells susceptible to SEUs; and
      a plurality of unidirectional logic circuits, each unidirectional logic circuit having an input terminal coupled to an associated multiplexer input terminal, an output terminal coupled to the multiplexer output terminal, and a control terminal coupled to an output terminal of an associated memory cell.

13. The system of claim 12, wherein:
   a first logic circuit implements at least a portion of a first TMR module;
   a second logic circuit implements at least a portion of a second TMR module; and
   one of the programmable routing multiplexer circuits has a first multiplexer input terminal coupled to an output terminal of the first logic circuit and a second multiplexer input terminal coupled to an output terminal of the second logic circuit.

14. The system of claim 12, wherein each unidirectional logic circuit comprises a unidirectional buffer and a pass gate coupled in series between the associated multiplexer input terminal and the multiplexer output terminal, the pass gate having a gate terminal coupled to the output terminal of the associated configuration memory cell.

15. The system of claim 14, wherein the pass gates comprise N-channel transistors.

16. The system of claim 14, wherein the unidirectional buffer is a non-inverting buffer.

17. The system of claim 12, wherein each unidirectional logic circuit comprises a tristate buffer having an input terminal coupled to an associated multiplexer input terminal, an output terminal coupled to the multiplexer output terminal, and an enable terminal coupled to the output terminal of the associated memory cell.

18. The system of claim 17, wherein the tristate buffer is an inverting buffer, and each of the programmable routing multiplexer circuits further comprises an inverting output buffer having an input terminal coupled to the multiplexer output terminal.

19. The system of claim 12, wherein each of the programmable routing multiplexer circuits further comprises an output buffer having an input terminal coupled to the multiplexer output terminal.

20. The system of claim 12, wherein the system comprises a programmable logic device (PLD).

21. The system of claim 20, wherein the PLD is a field programmable gate array (FPGA).

22. The system of claim 12, wherein each programmable routing multiplexer circuit comprises eight multiplexer input terminals, eight memory cells, and eight unidirectional logic circuits.

23. The system of claim 12, wherein each programmable routing multiplexer circuit further comprises an output buffer coupled between the output terminals of the unidirectional logic circuits and the multiplexer output terminal.

24. A programmable routing multiplexer circuit, comprising:
   a plurality of multiplexer input terminals;
   a multiplexer output terminal;
   a plurality of configuration memory cells; and
   a plurality of unidirectional logic circuits, each unidirectional logic circuit having an input terminal coupled to an associated multiplexer input terminal, an output terminal coupled to the multiplexer output terminal, and a control terminal coupled to an output terminal of an associated configuration memory cell.

25. The programmable routing multiplexer circuit of claim 24, wherein:
   a first multiplexer input terminal is coupled to a first TMR module; and
   a second multiplexer input terminal is coupled to a second TMR module.

26. The programmable routing multiplexer circuit of claim 24, wherein each unidirectional logic circuit comprises a unidirectional buffer and a pass gate coupled in series between the associated multiplexer input terminal and the multiplexer output terminal, the pass gate having a gate terminal coupled to the output terminal of the associated configuration memory cell.

27. The programmable routing multiplexer circuit of claim 26, wherein the pass gates comprise N-channel transistors.

28. The programmable routing multiplexer circuit of claim 26, wherein the unidirectional buffer is a non-inverting buffer.

29. The programmable routing multiplexer circuit of claim 24, wherein each unidirectional logic circuit comprises a tristate buffer having an input terminal coupled to an associated multiplexer input terminal, an output terminal coupled to the multiplexer output terminal, and an enable terminal coupled to the output terminal of the associated configuration memory cell.

30. The programmable routing multiplexer circuit of claim 29, wherein the tristate buffer is an inverting buffer, and the programmable routing multiplexer circuit further comprises an inverting output buffer having an input terminal coupled to the multiplexer output terminal.

31. The programmable routing multiplexer circuit of claim 24, wherein the programmable routing multiplexer circuit further comprises an output buffer having an input terminal coupled to the multiplexer output terminal.

32. The programmable routing multiplexer circuit of claim 24, wherein the programmable routing multiplexer circuit comprises eight multiplexer input terminals, eight configuration memory cells, and eight unidirectional logic circuits.

* * * * *